United States Patent [19]

Yankoff

[11] Patent Number: 4,730,746
[45] Date of Patent: Mar. 15, 1988

[54] ENCLOSURE

[75] Inventor: Gerald K. Yankoff, Cincinnati, Ohio

[73] Assignee: Ulticon Systems, Inc., Blue Ash, Ohio

[21] Appl. No.: 902,156

[22] Filed: Aug. 29, 1986

[51] Int. Cl.$^4$ .......................... B65D 6/16; B65D 43/08
[52] U.S. Cl. ................................ 220/4 F; 220/81 R; 220/357; 217/12 R; 74/606 R
[58] Field of Search .......... 74/606 R; 220/4 F, 81 R, 220/357, 358; 217/12 R, 13, 43 R

[56]  References Cited

U.S. PATENT DOCUMENTS

| | | | |
|---|---|---|---|
| 1,023,577 | 4/1912 | List | 220/4 F |
| 1,711,176 | 4/1929 | Moore | 220/357 |
| 1,834,553 | 12/1931 | Seabold | 217/12 R |
| 2,299,175 | 10/1942 | Procissi | 217/12 R |
| 3,019,333 | 1/1962 | Pascucci | 220/4 F |
| 3,540,613 | 11/1970 | Hudson | 220/4 F |
| 3,955,320 | 5/1976 | Serouy | 220/4 F |

Primary Examiner—George E. Lowrance
Attorney, Agent, or Firm—Wood, Herron & Evans

[57] ABSTRACT

An enclosure for machinery or other items comprises a base, opposed sidewalls, opposed endwalls and a top cover. The endwalls are fixed to the base and have side edges which taper inwardly toward one another from bottom to top and are bent inwardly to form flanges which mount a strip of rubber. The sidewalls extend between the side edges of the endwalls and rest against the rubber strips and the base. The top cover is formed with a pair of opposed side flanges each having a strip of rubber mounted to the inner face thereof. Preferably, the distance between the rubber strips on the opposed side flanges of the top cover is less than the distance between the sidewalls. The sidewalls are mounted to the endwalls by deflecting the side flanges of the top cover outwardly relative to one another, moving the top cover downwardly to a seated position against the top of the endwalls and then releasing the side flanges of the top cover so that they deflect inwardly and their rubber strips engage the sidewalls to lock them in place against the endwalls.

5 Claims, 4 Drawing Figures

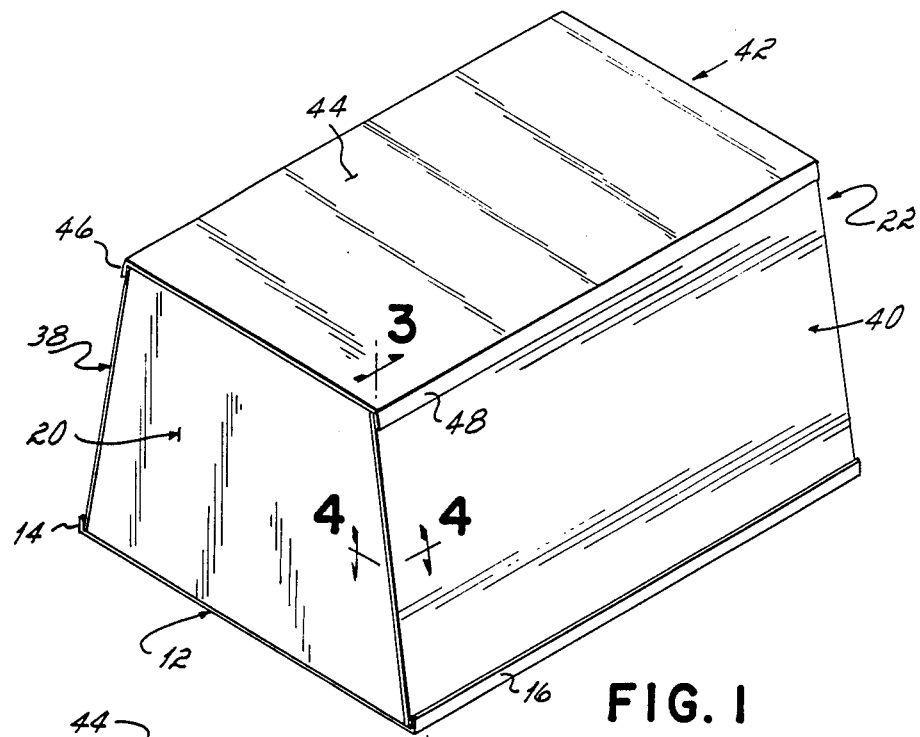
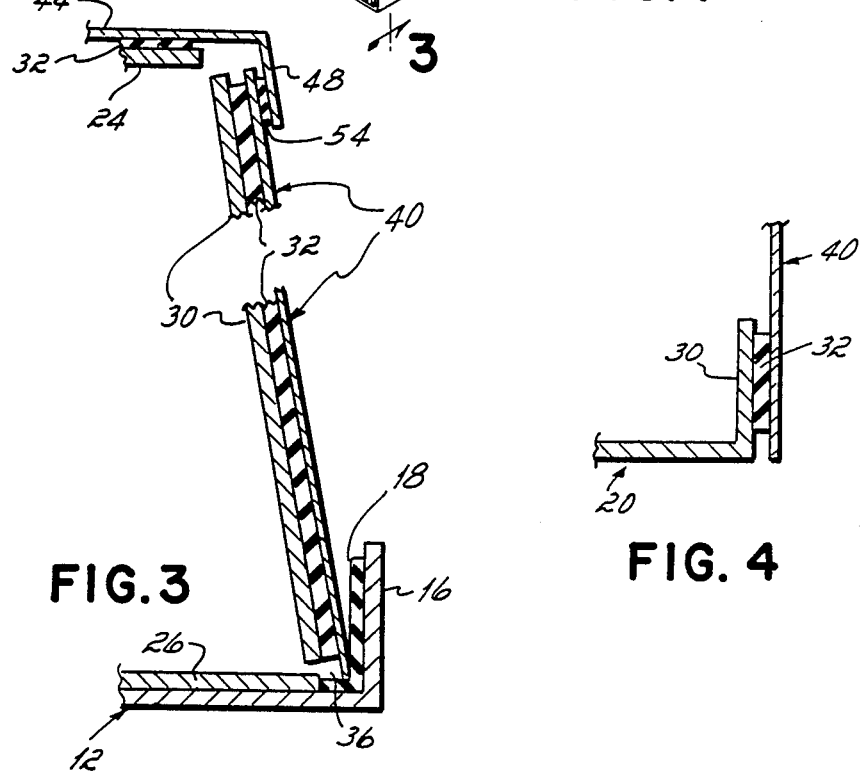

ENCLOSURE

BACKGROUND OF THE INVENTION

This invention relates to enclosures, and, more particularly, to sheet metal enclosures for machine tools, machinery and other applications.

Many machines require an enclosure or shroud to protect the machines from contamination from the environment and/or to protect workers from the machines during operation. For example, machine tools intended to perform boring, turning, facing, grooving or other metal working operations often require shrouds to protect the operator from the coolant spray, the metal chips formed in the course of the machining operation or portions of the cutting insert which may fracture and be thrown from the machine in the event of failure of the insert.

Shrouds or enclosures for machine tools and other machinery are usually formed of sheet metal and compromise opposed sidewalls, opposed endwalls, a top and a bottom interconnected at the corners. Typically, flanges are formed by bending the ends of each sidewall and endwall where they meet to form the corners of the shroud, and a series of mounting holes are drilled in each flange which receive metal screws for attaching the sidewalls to the endwalls. The same means of attachment can be used to connect the top and bottom sections to the sidewalls and endwalls.

Prior art sheet metal enclosures or shrouds made in this fashion have several disadvantages. Relatively close tolerances must be maintained in the formation of the bends in the wall sections at the corners of the shroud, and in the location of the mounting holes therealong, or substantial difficulties can arise in the assembly operation. If the corner sections of the walls are not bent properly to form the flanges or if the mounting holes are not drilled at the same intervals along each corner flange, it is extremely difficult to properly align the mounting holes of one wall with the mounting holes of another wall to insert the metal screws. Often the corners of the walls must be bent and forced together in order for the mounting holes to align. This requires the labor of two or more individuals, one to align the wall sections and the other to insert the metal screws, which substantially increases the costs of assembly of such prior art shrouds.

Problems with prior art shrouds of the type described above are also encountered during disassembly for maintenance or any other purpose. The metal screws are easily worn when threaded into and out of the mounting holes, and can become lost when the shroud is disassembled. Additionally, a large number of mounting screws are often required to securely interconnect the walls, top and bottom of the shroud which require a substantial amount of time to remove when access to the interior of the shroud is desired.

Another problem with prior art shrouds is that they can be noisy, particularly if the machinery housed by the shroud vibrates while operating. The metal screws connecting the corners of the walls are often loosened by the vibrations causing the screws to rattle within the mounting holes. If the screws loosen enough to allow the flanges at the corners of the shroud to separate, the walls vibrate against one another creating further noise.

SUMMARY OF THE INVENTION

It is therefore among the objectives of this invention to provide an enclosure or shroud which is economical to fabricate, which is easy to assemble and disassemble, which requires no screws or other fasteners for assembly and which resists disassembly due to vibration or other movements of the object enclosed.

These objectives are accomplished in a shroud which comprises a base, opposed endwalls, opposed sidewalls and a top cover. The bottom of the endwalls are fixedly mounted to the base, and in a presently preferred embodiment each has side edges which extend upwardly from the base and taper inwardly toward one another from bottom to top. The bottom edge of each sidewall rests against the base and extends upwardly along the side edges of the opposed endwalls so that the sidewalls, in turn, taper inwardly from bottom to top. A top cover is insertable over the sidewalls to secure the sidewalls against the endwalls and form a closed interior. The top cover includes a top sheet and opposed side flanges connected to the top sheet, which, in a presently preferred embodiment, taper or angle away from one another.

In a presently preferred embodiment, the side edges of the endwalls, and its top edge, are bent inwardly to form flanges which mount a strip of resilient material such as rubber. The same material is also mounted in strips along the inner face of the tapered, side flanges of the top cover. These strips of resilient material aid in damping any vibrations produced by the machine housed with the shroud which may be transmitted between its walls, and thus reduce noise.

In addition, the strips of resilient material are compressible to aid in positively interlocking the top cover with the sidewalls. Preferably, the distance between the rubber strips mounted to the inner faces of the opposed side flanges connected to the top cover is less than the distance between the opposed sidewalls when they are positioned against the endwalls. In order to mount the top cover to the sidewalls, the opposed flanges are deflected outwardly relative to one another so that the rubber strips on their inner faces fit over the sidewalls. The side flanges are then released when the top sheet seats against the top edge of the endwalls allowing the opposed side flanges to deflect inwardly toward one another and tightly lock against the sidewalls which places the rubber strips on their inner faces in compression. The top sheet acts, in effect, like a spring to wedge the sidewalls between its opposed side flanges and the rubber strips mounted thereto. In the seated position of the top cover, with its side flanges wedged against the sidewalls, the strip of resilient material along the top edge of each endwall engages the top sheet of the top cover and helps dampen vibrations between the endwall and the top cover.

In order to disassemble the shroud, the side flanges are deflected away from one another, the top cover is lifted upwardly from the sidewalls and the sidewalls are then removed to permit access to the interior of the shroud.

The construction of the shroud herein does not require metal screws or other fasteners to interconnect the corners of the sidewalls and endwalls. The sidewalls of the shroud are completely removable and merely rest against the base and side edges of the endwalls. Additionally, the strips of resilient material mounted to the endwalls and top cover aid in securing the top cover to the sidewalls and help dampen the transmission of vibration between the sidewalls, endwalls and top cover to reduce noise.

DESCRIPTION OF THE DRAWINGS

The structure, operation and advantages of a presently preferred embodiment of this invention will become further apparent upon consideration of the following description taken in conjunction with the accompanying drawings, wherein:

FIG. 1 is a perspective view of one embodiment of the enclosure herein;

FIG. 3 is a cross sectional view of the corner of the enclosure taken generally along line 3—3 of FIG. 1; and FIG. 4 is a cross sectional view taken generally along line 4—4 of FIG. 1.

DETAILED DESCRIPTION OF THE INVENTION

Figure 2:
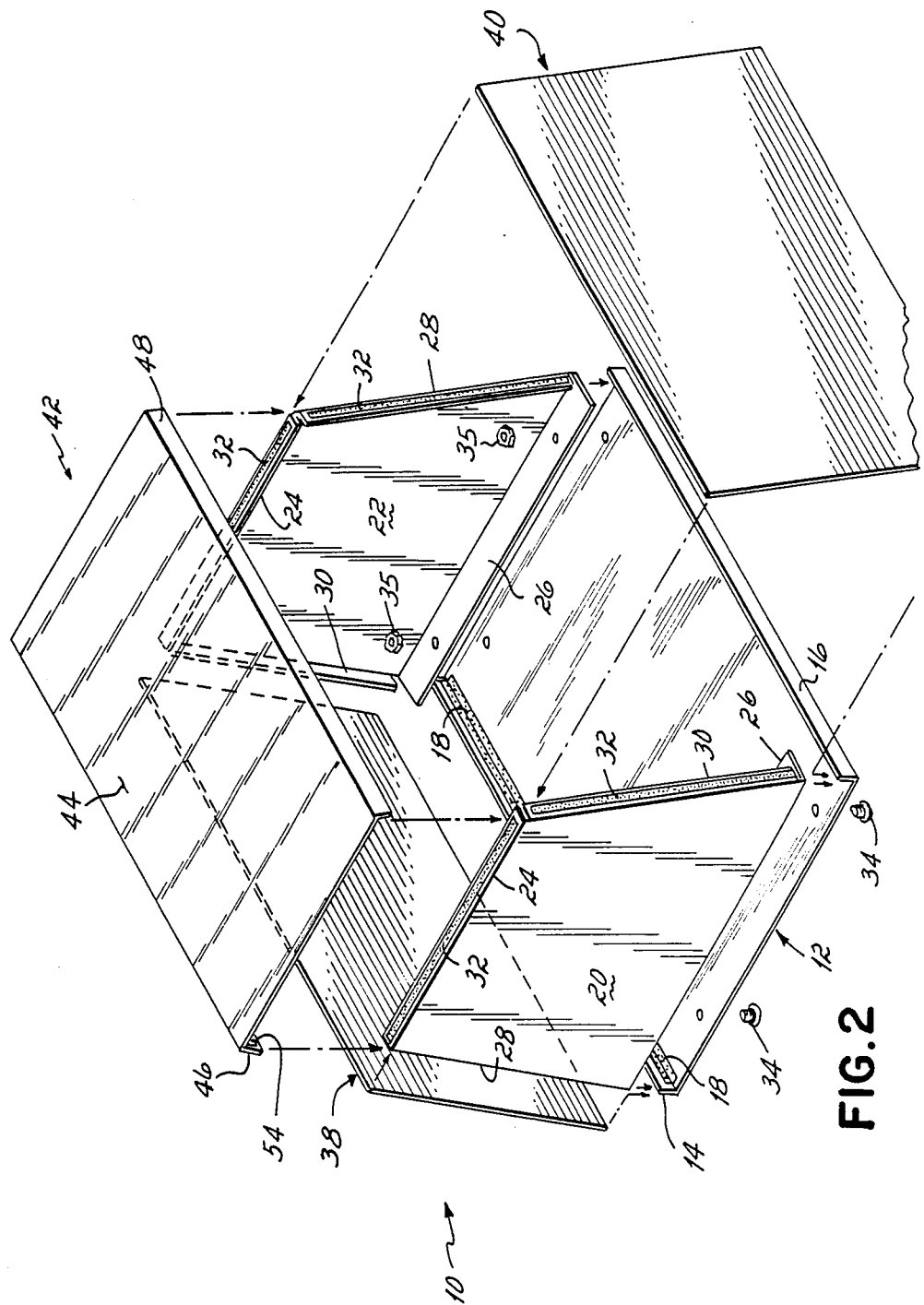
FIG. 2 is an exploded perspective view of an enclosure herein.

Referring now to the Figs., the enclosure or shroud 10 includes a base 12 whose side edges are bent upwardly to form opposed, upright flanges 14, 16. Alternatively, angle irons (not shown) are permanently mounted to the side edges of the base 12. In a presently preferred embodiment, a strip 18 of resilient material such as rubber is attached to the internal corner formed by each of the flanges 14, 16 and base 12, for purposes to become apparent below.

In a presently preferred embodiment, a pair of opposed endwalls 20, 22 are each formed in a generally trapezoidal shape having opposed, parallel top and bottom edges 24, 26, respectively, and opposed side edges 28, 30 which taper inwardly toward one another from the bottom section 26 to the top section 24. In the embodiment illustrated in the Figs., the side edges 28, 30 and top edge 24 are bent inwardly to form flanges which mount separate strips 32 of resilient material such as rubber. The bottom edge 26 is also bent inwardly, and is mounted to the base 12 by bolts 34 and nuts 35 to secure the endwalls 20, 22 in an upright position at opposite ends of the base 12. As best shown in FIG. 3, the width of the endwalls 20, 22 at their bottom section 26 is slightly less than the width of base 12 to provide a gap or slot 36 between the endwalls 20, 22 and each of the flanges 14, 16 within which the rubber strips 18 are mounted.

A pair of opposed sidewalls 38, 40 extend between the endwalls 20, 22 to form the sides of the shroud 10. The bottom edge of sidewall 38 is inserted within the slot 36 atop the rubber strip 18 on the base 12, and rests against the tapered side edges 28 of endwalls 20, 22. Similarly, sidewall 40 is inserted within the slot 36 atop the rubber strip 18 at the opposite side of base 12, and rests against the tapered side edges 30 of endwalls 20, 22. The flanges 14, 16 on the sides of the base 12 prevent outward movement of the bottom of sidewalls 38, 40, respectively, and the rubber strips 18 dampen vibration therebetween. In addition, the ends of sidewalls 38, 40 rest against the rubber strips 32 on the side edges 28, 30 of endwalls 20, 22 to further dampen vibration. No screws or other fasteners are employed to secure the sidewalls 38, 40 in place.

The shroud 10 is enclosed by a top cover 42 which comprises a top plate 44 connected to opposed, side flanges 46, 48. In a presently preferred embodiment, the side flanges 46, 48 taper outwardly at an angle relative to one another, from the top plate 44 downwardly. The inner faces of side flanges 46, 48 each receive a strip 54 of resilient, compressible material such as rubber. The distance or width between the rubber strips 54 on the inner faces of side flanges 46, 48 is less than the distance between the opposed sidewalls 38, 40 when they are in position against the endwalls 20, 22.

In order to secure the sidewalls 38, 40 to the endwalls 20, 22, the side flanges 46, 48 of top cover 42 are deflected or bent outwardly relative to one another so that the rubber strips 54 on their inner faces fit over the sidewalls 38, 40. The top cover 42 is then moved downwardly toward the base 12 so that the side flanges 46, 48 of top cover 42 extend along the sidewalls 38, 40 and the top plate 44 engages the strips 32 mounted to the top plate 24 of endwalls 20, 22. The side flanges 46, 48 are then released and deflect inwardly toward one another securing them tightly in position against the endwalls 20, 22. The resilient strips 54 on the inner faces of side flanges 46, 48 undergo compression when the side flanges 46, 48 of top cover 42 are released to ensure a tight fit therebetween. In effect, the top sheet 44 acts like a spring to urge the opposed side flanges 46, 48 inwardly toward one another and against the sidewalls 38, 40.

In order to gain access to the interior of the shroud 10, the side flanges 46, 48 of top cover 42 are deflected outwardly relative to one another and the top sheet 44 is removed from the sidewalls 38, 40. Once the top cover 42 is removed, the sidewalls 38, 40 are released and can be removed from the fixed endwalls 20, 22 to permit access to the entire interior of the shroud 10.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

For example, the shroud 10 is illustrated as an integral unit in the Figs., with a base 12 having flanges 14, 16. This structure could be modified, for example, by the end sections directly to the floor with angle irons therebetween along the sides to form an essentially permanently positioned base for a given application.

In addition, the opposed side flanges 46, 48 of the top cover 42 and opposed sidewalls 38, 40 of the shroud 10 are shown with mating, tapered surfaces. As illustrated, the sidewalls 38, 40 tape inwardly toward one another from bottom to top, and the side flanges 46, 48 of top cover 42 taper outwardly relative to one another to mate with the sidewalls 38, 40. This ensures that the rubber strips 54 on the inner faces of side flanges 46, 48 are compressed along the entire length and width thereof to provide a tight fit against the sidewalls 38, 40.

It is contemplated, however, that the side flanges 46, 48 and sidewalls 38, 40 need not have mating surfaces to secure the top cover 42 to the sidewalls 38, 40. For example, the side flanges 46, 48 could be tapered and the sidewalls 38, 40 vertical, or both the side flanges 46, 48 and sidewalls 38, 40 could be vertical, and still obtain the desired locking arrangement so long as the distance between the rubber strips 54 mounted to the inner faces of side flanges 46, 48 is less than the distance between the sidewalls 38, 40. Preferably, this relative distance is such that the rubber strips 54 undergo sufficient compression to exert a larger force inwardly against the sidewalls 38, 40 than the force exerted by gravity on the sidewalls 38, 40 tending to make them drop or fall outwardly away from the side edges 28, 30 of the endwalls 20, 22.

Therefore, it is intended that the invention not be limited to the particular embodiment disclosed as the best mode contemplated for carrying out this invention, but that the invention will include all embodiments falling within the scope of the appended claims.

What is claimed is:

1. A sheet metal enclosure, comprising:
   a base;
   a pair of spaced endwalls each having a top edge, opposed side edges and a bottom edge connected to said base, said side edges of each said endwalls tapering inwardly toward one another from said bottom edge to said top edge of said endwalls;
   a pair of spaced sidewalls each having a bottom edge engaging said base, each of said sidewalls extending between said endwalls and engaging a side edge thereof so that said sidewalls taper inwardly toward one another from bottom to top;
   a top cover having a sheet and opposed side flanges, said opposed side flanges being connected to said sheet and tapering outwardly at an angle relative to one another forming opposed inner surfaces, a strip of resilient material being mounted to each of said inner surfaces;
   said top cover being insertable over said tapered sidewalls so that said strips of resilient material mounted to said inner surfaces of said opposed side flanges engage said sidewalls, said sidewalls being wedged between said opposed side flanges of said top cover to lock said sidewalls against said endwalls and to lock said top cover to said sidewalls.

2. The sheet metal enclosure of claim 1 in which said base comprises a bottom plate bent at each side edge to form opposed upright flanges, said side edges of said endwalls being spaced from said flanges to form a slot therebetween for receiving said bottom edge of said sidewalls.

3. The sheet metal enclosure of claim 2 in which a strip of resilient material is mounted to each of said upright flanges and a portion of said bottom plate within said slot, said bottom edge of said sidewalls resting against said strip of resilient material.

4. The sheet metal enclosure of claim 1 in which said top edge and said opposed side edges of each said endwalls are each bent inwardly to form a flange, each of said flanges being at least partially covered with a strip of resilient material, said sidewalls engaging said strips of resilient material on said side edges of said endwalls and said top cover engaging said strips of resilient material on said top of said endwalls to dampen the transmission of vibration therebetween.

5. A sheet metal enclosure, comprising
   a base;
   a pair of spaced endwalls each having a top edge, opposed side edges and a bottom edge connected to said base;
   a pair of spaced sidewalls each having a bottom edge engaging said base, each of said sidewalls extending between said endwalls and engaging a side edge thereof;
   a top cover having a sheet and opposed side flanges connected to said sheet defining opposed inner surfaces, a strip of resilient material being mounted to each of said opposed inner surfaces;
   the distance between said strips of resilient material mounted to said inner surfaces of said opposed side flanges of said top cover being less than the distance between said spaced sidewalls, said side flanges being adapted to be deflected outwardly relative to one another to permit placement of said top cover over said sidewalls, said side flanges thereafter being releasable to deflect inwardly toward one another so that said strips of resilient material on said inner faces thereof engage and lock said sidewalls into position against said endwalls.

* * * * *